(12) United States Patent
Edwards (10) Patent No.: US 7,791,179 B2
(45) Date of Patent: Sep. 7, 2010

(54) INTEGRATED BATTERY PACK WITH LEAD FRAME CONNECTION

(75) Inventor: Malcolm Edwards, Hoehenkirchen (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 173 days.

(21) Appl. No.: 12/008,153

(22) Filed: Jan. 9, 2008

(65) Prior Publication Data

US 2008/0116550 A1 May 22, 2008

Related U.S. Application Data

(62) Division of application No. 10/756,700, filed on Jan. 13, 2004, now Pat. No. 7,332,363.

(30) Foreign Application Priority Data

Dec. 15, 2003 (EP) .................. 03392012

(51) Int. Cl.
*H01L 23/495* (2006.01)
(52) U.S. Cl. ..................... 257/666; 257/724
(58) Field of Classification Search ........... 257/666, 257/676, 723, 724
See application file for complete search history.

(56) References Cited

U.S. PATENT DOCUMENTS

| | | | |
|---|---|---|---|
| 4,645,943 A | | 2/1987 | Smith, Jr. et al. |
| 5,055,704 A | * | 10/1991 | Link et al. .......... 307/66 |
| 5,119,269 A | | 6/1992 | Nakayama |
| 5,294,829 A | * | 3/1994 | Hundt ............. 257/678 |
| 5,451,715 A | | 9/1995 | Hundt et al. |
| 5,498,903 A | * | 3/1996 | Dixon et al. .......... 257/690 |
| 5,541,490 A | | 7/1996 | Sengupta et al. |
| 5,570,273 A | * | 10/1996 | Siegel et al. .......... 361/773 |
| 5,610,800 A | * | 3/1997 | Hundt et al. .......... 361/761 |
| 5,914,534 A | | 6/1999 | Todd et al. |
| 6,109,530 A | | 8/2000 | Larson et al. |
| 6,191,955 B1 | | 2/2001 | Guillot et al. |
| 6,198,253 B1 | | 3/2001 | Kurle et al. |
| 6,284,406 B1 | | 9/2001 | Xing et al. |
| 2002/0004163 A1 | | 1/2002 | Matsuura |

FOREIGN PATENT DOCUMENTS

WO WO 01/97583 12/2001

OTHER PUBLICATIONS

"Pump Printing, ProFlow and the new power generation", How DEK's process engineering helped advance mobile battery performance, 4 pages, by Karen Moore-Watts, Sep. 3, 2001 found: http://www.dek.com/commsinsf/PA/OA803F8CEEEDC25C80256....

* cited by examiner

*Primary Examiner*—S. V Clark
(74) *Attorney, Agent, or Firm*—Saile Ackerman LLC; Stephen B. Ackerman (57) ABSTRACT

An integrated battery package, that contains semiconductor chips, for example to control and regulate battery charging and to monitor the package operation, uses a single lead frame to interconnect several internal chips, to internally connect said control chips to the battery and to connect the whole package assembly externally. The invention eliminates the need for any additional connecting mechanism. The invention uses established production processes. A molding process, similar to plastic chip encapsulation, encloses the battery controlling chips and forms at the same time the body of the battery package. An additional cover, sealed to said body, closes the battery package.

11 Claims, 7 Drawing Sheets

INTEGRATED BATTERY PACK WITH LEAD FRAME CONNECTION

This is a divisional application of U.S. patent application Ser. No. 10/756,700, filed on Jan. 13, 2004, now U.S. Pat. No. 7,332,363, which is herein incorporated by reference in its entirety, and assigned to a common assignee.

BACKGROUND OF THE INVENTION (1) Field of the Invention

This invention relates generally to a battery assembly, and more particularly to an assembly technique to incorporate electronic functions within removable battery packs, where all components are interconnected using a lead frame technology.

(2) Description of Prior Art

Many portable electronic devices require removable battery packs. Sometimes electronic monitoring and control functions communicating between the battery and said electronic device are incorporated within the battery pack. Usually the bare battery cells have to be mounted together with any required electronics into a sealed housing with exposed electrical contacts to connect the pack to the electronic device using it.

Figure 1A:
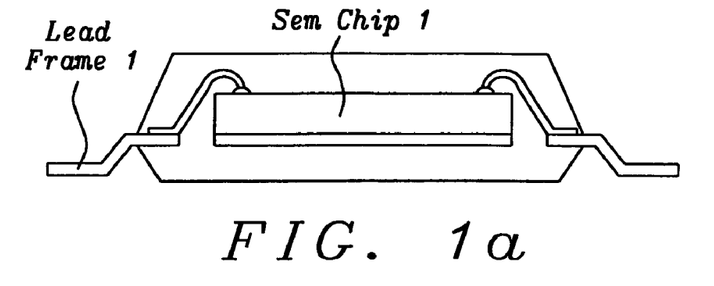
FIG. 1a and 1b (Prior Art) shows a cross section of semiconductor modules, using lead frame technology.
Figure 1B:
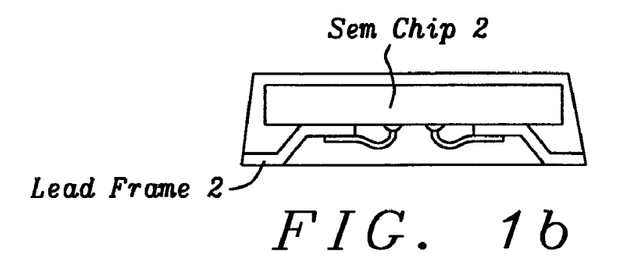
Figure 2:
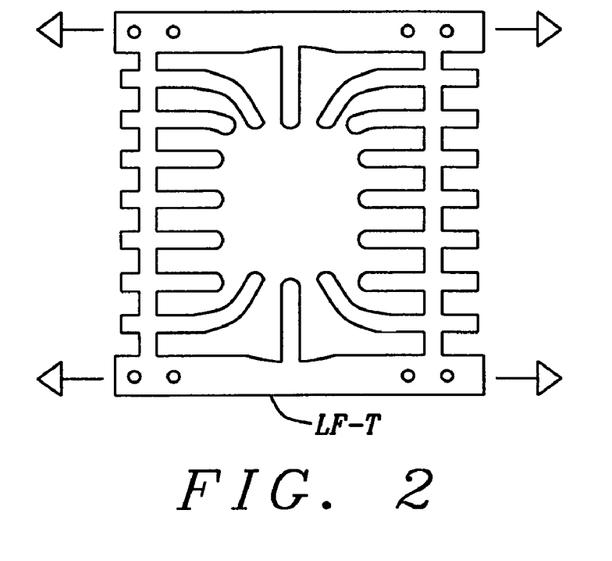
FIG. 2 (Prior Art) shows a single section of a lead frame tape as used in semiconductor packaging.

Normally, semiconductor chips are mechanically connected to a chip-carrier, typically a lead frame in today's technology, which is then connected to a printed circuit board. Further connecting devices would then connect to said printed circuit board. A plastic case with a bottom and top element would then enclose the whole assembly Integrated semiconductor modules often use the lead frame technology to carry the semiconductor chip and to connect the chip pads with a larger printed circuit board. These lead frames are normally encapsulated with a convenient plastic material. FIG. 1 (prior art) shows the cross sections of two typical examples of said semiconductor modules. FIG. 2 shows a bare lead frame, which is produced as a long tape of metal sheet. The basic material of lead frames is sheet metal. The leads are either metal-stamped or etched to form the leads, therefore complex forms of said leads can be achieved. The leads are typically pre-formed in a bending process to accommodate all kinds of shapes. A frame area around all leads holds said leads in position, until the chips are mounted and the assembly has been encapsulated (molded) into plastic material.

U.S. Pat. No. 5,498,903 to Dioxin et al. describes an integrated circuit package of the surface-mountable type within which a battery is mounted. Battery leads extend from the side of the package body opposite that which is adjacent the circuit board when mounted, and between which a conventional battery may be placed. A gap is present between the housing and the battery. The gaps thermally insulate the battery from the package body and housing, so that the circuit may be subjected to solder reflow mounting to a circuit board, while insulating the high temperature from the battery.

U.S. Pat. No. 6,109,530 to Larson et al. discloses a chip-battery micro-module and fabrication there of wherein an integrated circuit "chip" is secured to a battery coin cell using various conductive and insulating layers that provide power to the chip. The chip-battery micro-module may be used to power an electronic accessory that is directly attached thereto, such as an LCD display or speaker, or to power a circuit in a smart card or electronic device such as a portable phone. The chip battery micro-module can be integrated into a plastic smart card.

U.S. Pat. No. 6,284,406 B1 to Xing et al shows an IC card comprising an electronic device and a battery within a plastic card for electrically energizing the electronic device. The battery is comprised as a monolithic electro-chemical cell having a lithium-containing cathode, a carbon anode, and a porous polymer separator infused with electrolyte solution. The cell has a thickness of less than 0.7 mm. The battery has an overall thickness of less than 0.8 mm.

SUMMARY OF THE INVENTION

A principal object of the invention described herein is to build an integrated battery package, that contains semiconductor chips, for example to control and regulate battery charging and to monitor package operation, and that interconnects several of said internal chips, connects said chips to the battery within the package and connects the whole package assembly to the outside. The basic aspects of an assembly are to reduce the connection devices to a minimum and where the package is a smooth sided box.

In the disclosed invention, a single lead frame, specially designed and tailored for the envisioned task, serves several purposes: it connects the, possibly multi-chip electronic circuits, it connects the battery cells to said multichip circuit and it forms, without any additional parts, the external connectors of the completed package. A molding process, similar to some semiconductor module packaging technologies, encapsulates the inner section of the lead frame together with the assembled semiconductor chips and possibly other electrical components with plastic material into a small, probably flat, package. According to this invention, said mold is designed to form the bottom structure of the total package within that same production step. Several leads of the lead frame are pre-formed to attach to the battery cells. Two or more leads of said single lead frame are also pre-formed to finally build the external contacts. Finally, after the battery cells are mounted and connected to said lead frame, the package will be closed and sealed with a top cover, leaving only the essential external contacts being exposed outside.

According to the objectives, the lead frame may internally connect one or more semiconductor chips; it may also interconnect to other active and/or passive components, like capacitors. Some of said leads of said lead frame will be formed to accommodate a connection to said battery cells and other leads will be formed to build the external connection of the final package assembly. Forming of said leads can be realized during the original manufacturing process of said lead frames or pre-forming can be processed as a separate bending process before the electronic components are mounted to said lead frame. A separate bending process can even be performed after said semiconductor and other chips are mounted to said lead frame and after the inner section of the lead frame together with said mounted chips is encapsulated.

Further, according to the objectives of this invention, said molding process, encapsulating said semiconductor chips and the inner area of the lead frame, also forms the body structure of said battery package with an optimized design of said mold. The body, preferably designed as a flat structure, can also accommodate the fixture for said battery cells and form a lid to hold a top cover in place.

The lead frame can be manufactured in one of several processes, for example metal stamping and metal etching. Semiconductor chips and said passive components, like capacitors, may be attached to said lead frame with a known technique, like wire bonding, solder balls, solder pads and similar established processes. After molding the inner section, the outer frame, which holds the leads in their position during the manufacturing process, is cut away.

The battery cells could be electrically contacted to said leads by welding or with conductive adhesives or by similar means. The external connector may be placed on the same side or on opposites sides of the package and they may be placed in the bottom surface, parallel to the lead frame plane.

Finally, to get a smooth sided box, the whole battery package will most likely be closed with an additional cover element, put over the mounted battery cells and sealed to said body of the package. The pre-formed external contacts are then the only remaining connection to the package outside.

BRIEF DESCRIPTION OF THE DRAWINGS

In the accompanying drawings, forming a material part of this description, there is shown.

DESCRIPTION OF THE PREFERRED EMBODIMENTS

A principal object of the invention described in the present document is to build an integrated battery package in a smooth sided box, that contains semiconductor chips, for example to control and regulate battery charging and to monitor package operation, and that interconnects several of said internal chips, connects said chips to the battery within the package and connects the whole package to the outside. The basic aspect is to reduce the connection devices to a minimum.

The disclosed invention uses a similar lead frame technology and a similar molding technology, as used for semiconductor module packaging. In the disclosed invention, a single lead frame, specially designed for the envisioned purpose, is used. According to the invention, said lead frame serves several purposes at the same time: the first is to connect to the, possibly multi-chip electronic circuits, second, it connects the battery cells to said multichip circuit and it forms and third, without any additional parts, it builds the external connectors of the completed package.

Figure 3:
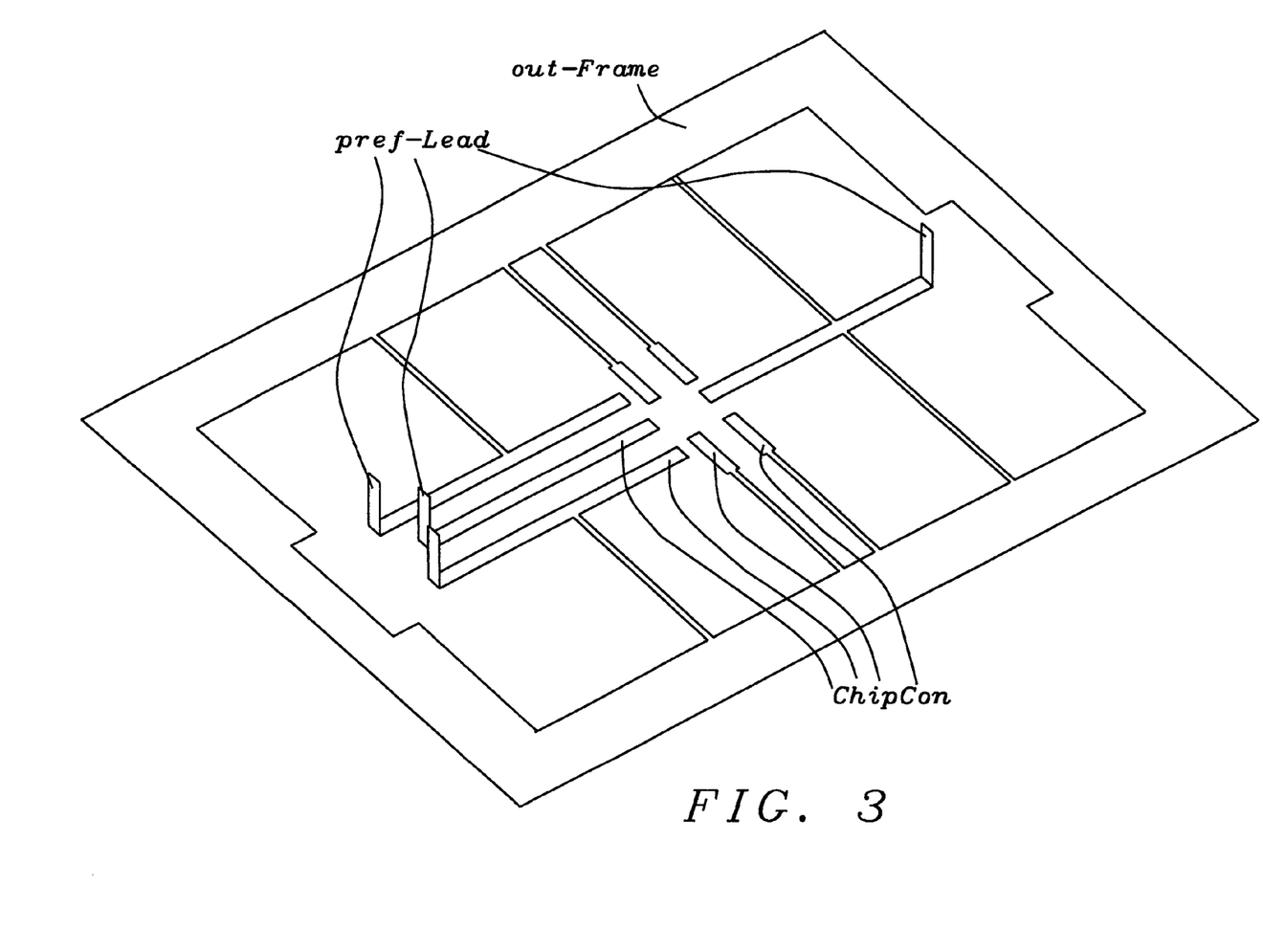
FIG. 3 shows the plain lead frame, according to the disclosure invention.
Figure 4:
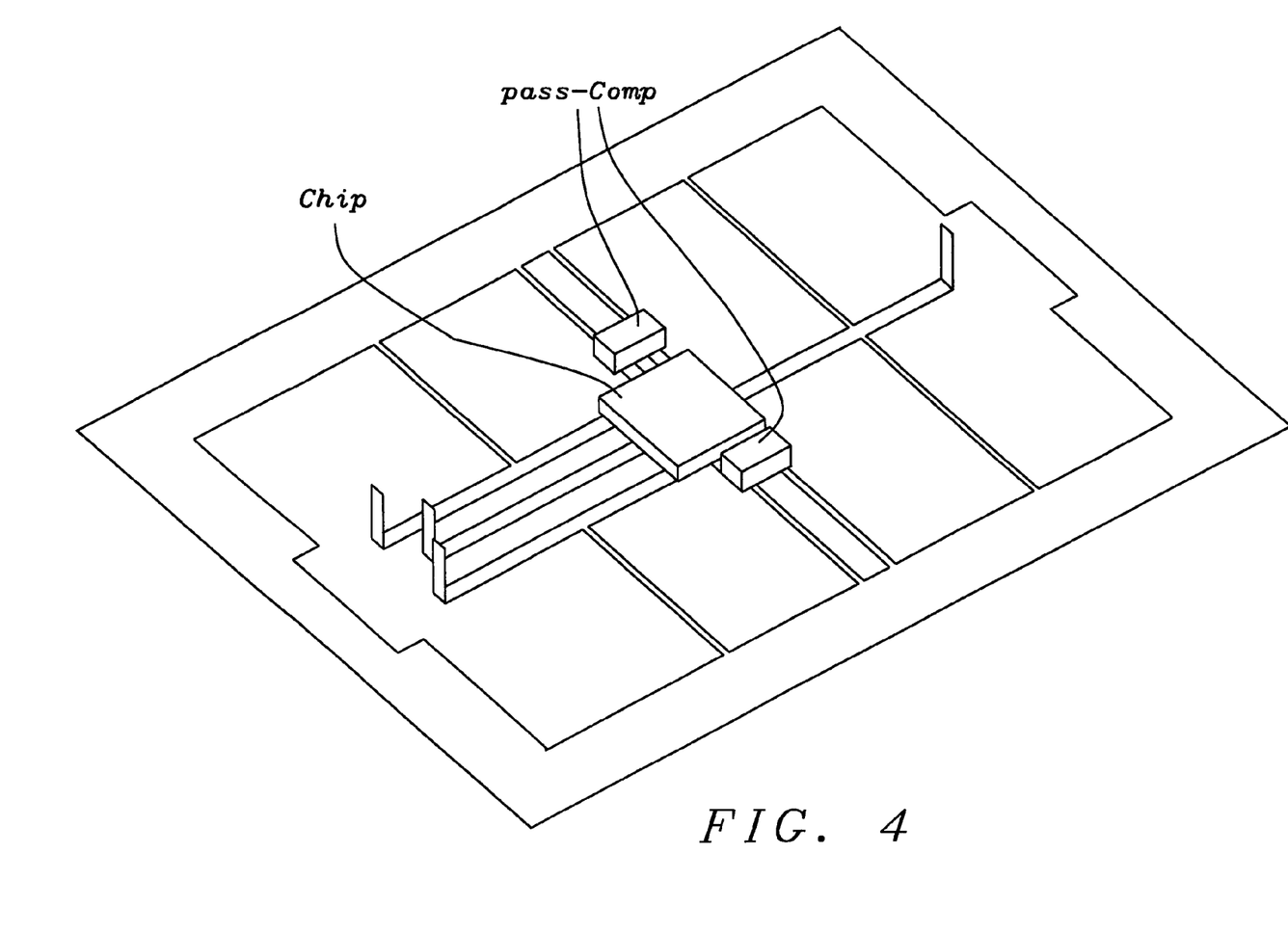
FIG. 4 shows said lead frame with controller and capacitor chips mounted.

An example for such lead frame is presented in FIG. 3. Lead frames can be manufactured in one of several processes, for example metal stamping and metal etching. The outer Frame out-Frame 3 holds all leads during the manufacturing process in place. Some of said leads of said lead frame will be formed to accommodate a connection to said battery cells and other leads will be formed to build the external connection of the final package. ChipCon 3 are the connection areas where the various chips will later be contacted. pref-Lead 3 points to the preformed leads for battery cells and for external package contacts. FIG. 4, shows said lead frame with the semiconductor chips Chip and the passive components pass-Comp mounted. The semiconductor chips and said passive components, like capacitors, may be attached to said lead frame with a known technique, like wire bonding, solder balls, solder pads and similar established processes.

Figure 5:
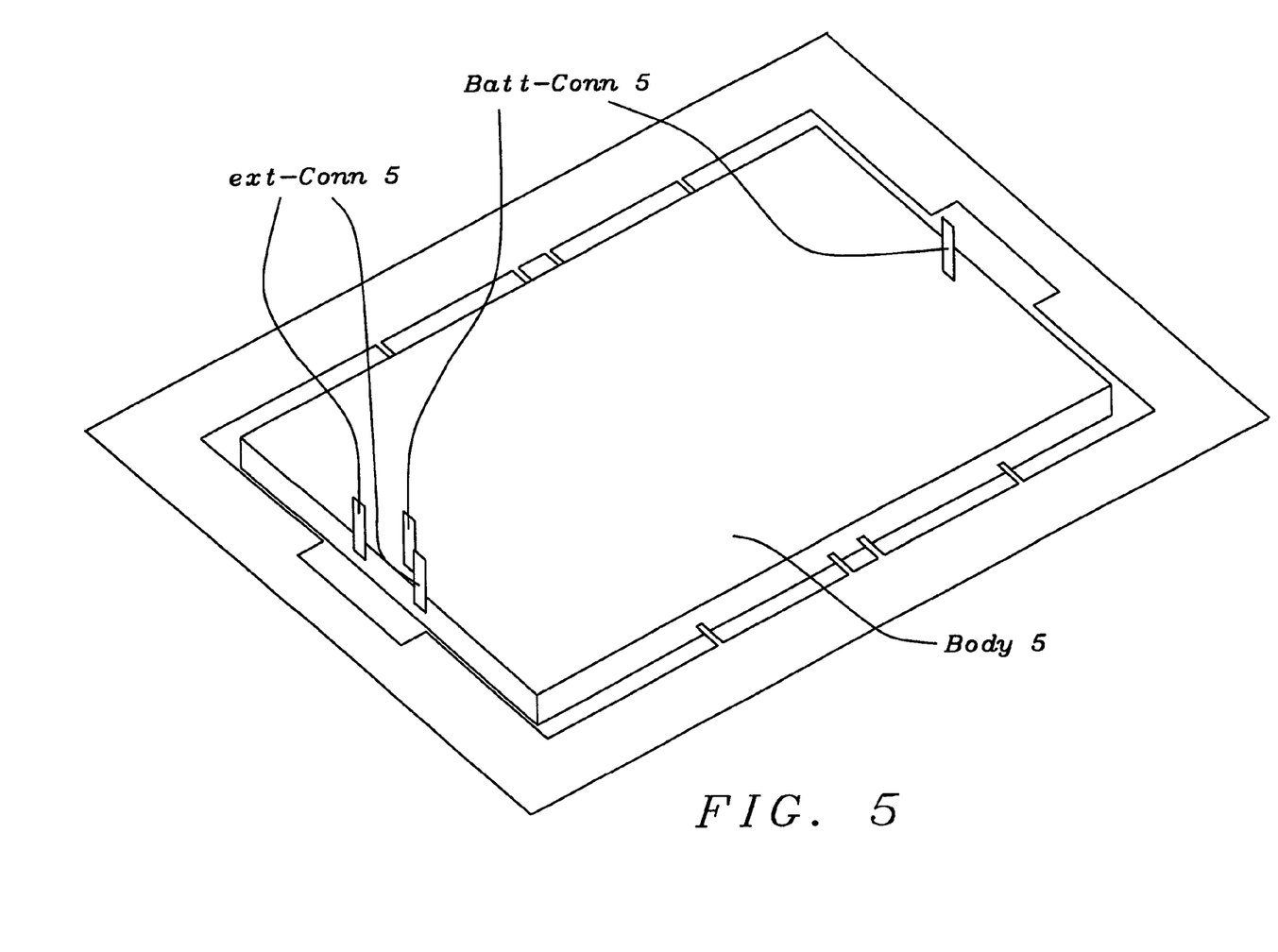
FIG. 5 visualizes said lead frame with mounted chips, encapsulated in a molded package.

Typical semiconductor modules encapsulate the inner section of the lead frame together with the connected chip by molding this assembly with convenient plastic material into a small, often flat, package. A similar molding concept and process is used for this invention, however additionally the mold is designed to form the bottom body of the total package in that same production step. The result of said molding process is shown in FIG. 5, the lead frame and the already mounted chips are encapsulated with a plastic material. The resulting structure will also serve as the body Body 5 of the total package. The chips are now buried inside the molded part, only said connections for battery cells Batt-Conn 5 and external connections ext-Conn 5 remain visible.

Forming said leads could be realized during the original manufacturing process of said lead frames. Pre-forming can also be processed as a separate bending process before said semiconductor and other chips are mounted to said lead frame. A separate bending process can even be performed after said semiconductor and other chips are mounted to said lead frame and after the inner section of the lead frame together with said mounted chips is encapsulated by molding the lead frame and chip assembly.

Figure 6:
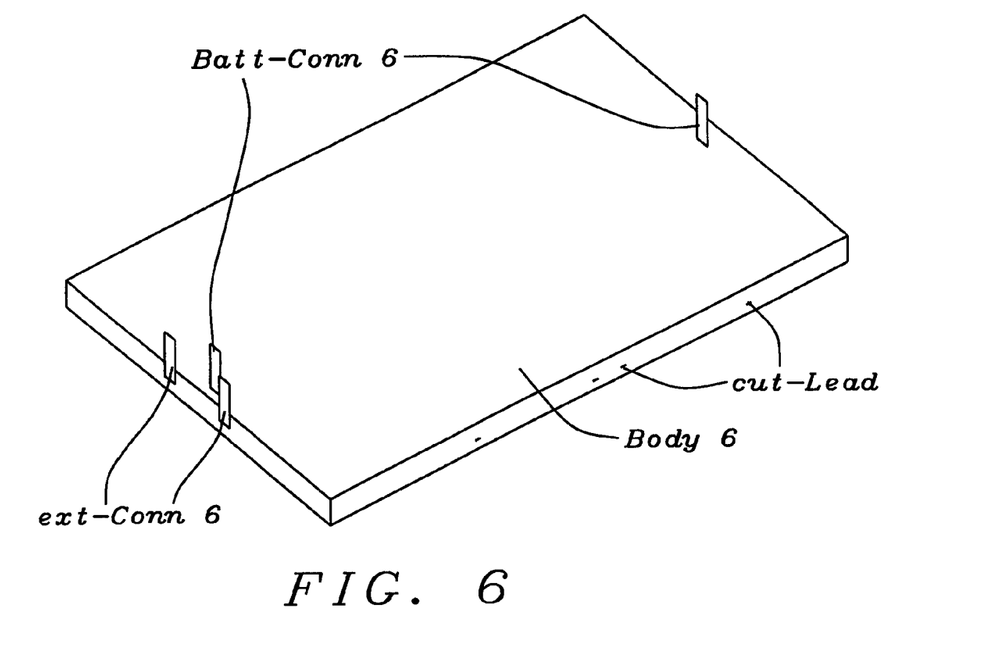
FIG. 6 shows the same molded package, forming the integrated package body, after the external frame to hold the leads in place is cut off.

In a next process step after molding the body, the outer area of said lead frame is being cut away, which results in the body package as shown in FIG. 6. Only the battery connection Batt-Conn 6 and the external connectors ext-Conn 6 remain visible. All other leads, that temporarily served to hold the internal leads in place, are cut off at the points cut-Lead.

Figure 7:
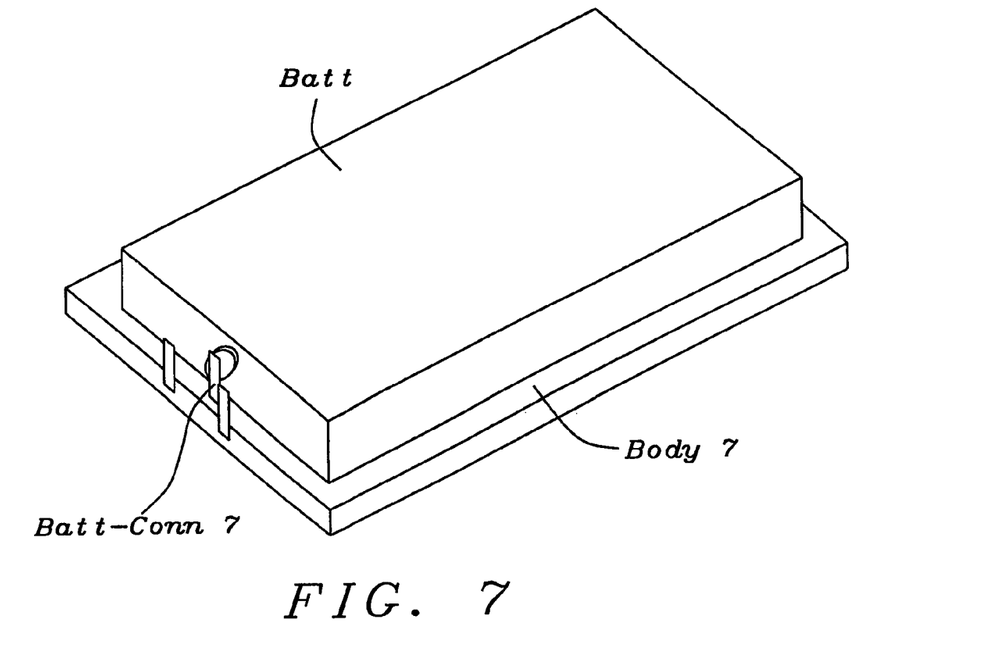
FIG. 7 demonstrates said integrated package body with the battery mounted on it.
Figure 8:
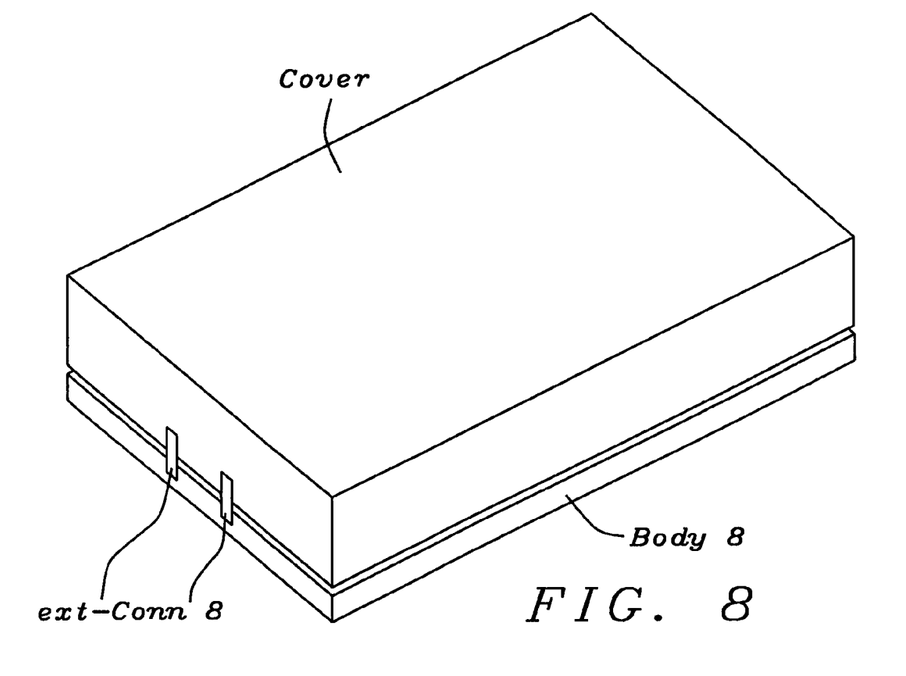
FIG. 8 shows the cover put over the integrated package body and battery assembly.
Figure 9:
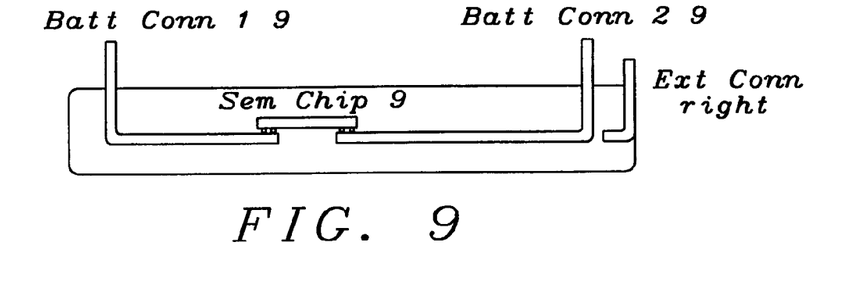
FIG. 9 shows a cross-section of said molded body with external battery package connectors at the face side of said body.
Figure 10:
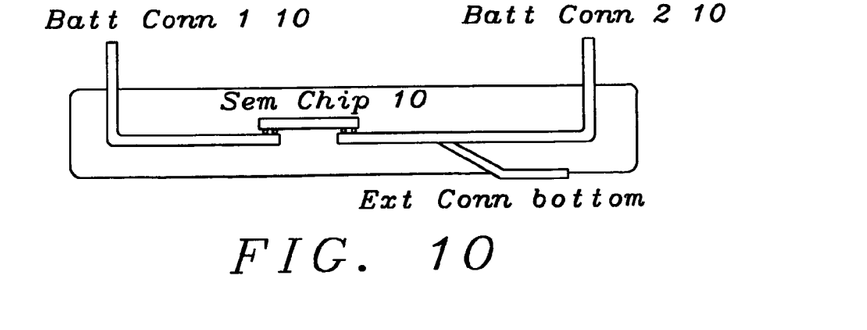
FIG. 10 shows a cross-section of said molded body with external battery package connectors at the bottom side of said body.

Then the battery cells are mounted; a principal concept for a possible solution is presented in FIG. 7, with the body Body 7 and the battery Batt. The battery cells could be electrically contacted to said battery connection Batt-Conn 7, by welding or with conductive adhesives or by similar means. Finally as shown in FIG. 8 the cover Cover is put over the assembled body and battery Body 8 and the package may be sealed. The pre-formed external contacts ext-Conn 8 are then the only remaining connection to the package outside. The external connector may be placed, for example, on the same side or on opposites sides of the package and they may be placed in the bottom surface, parallel to the lead frame plane. FIG. 9 and FIG. 10 show two possible examples for positioning said external contacts. Sem-Chip 9 and Sem-Chip 10 are the semiconductor chips, contacted to said lead frame with solder balls Batt Conn 1 9/1 10 and Batt Conn 2 9/2 10 are the battery connection in this example; Ext Conn right is a possible solution as shown in FIG. 9; Ext Conn bottom is a similar solution as shown in FIG. 10

Figure 11:
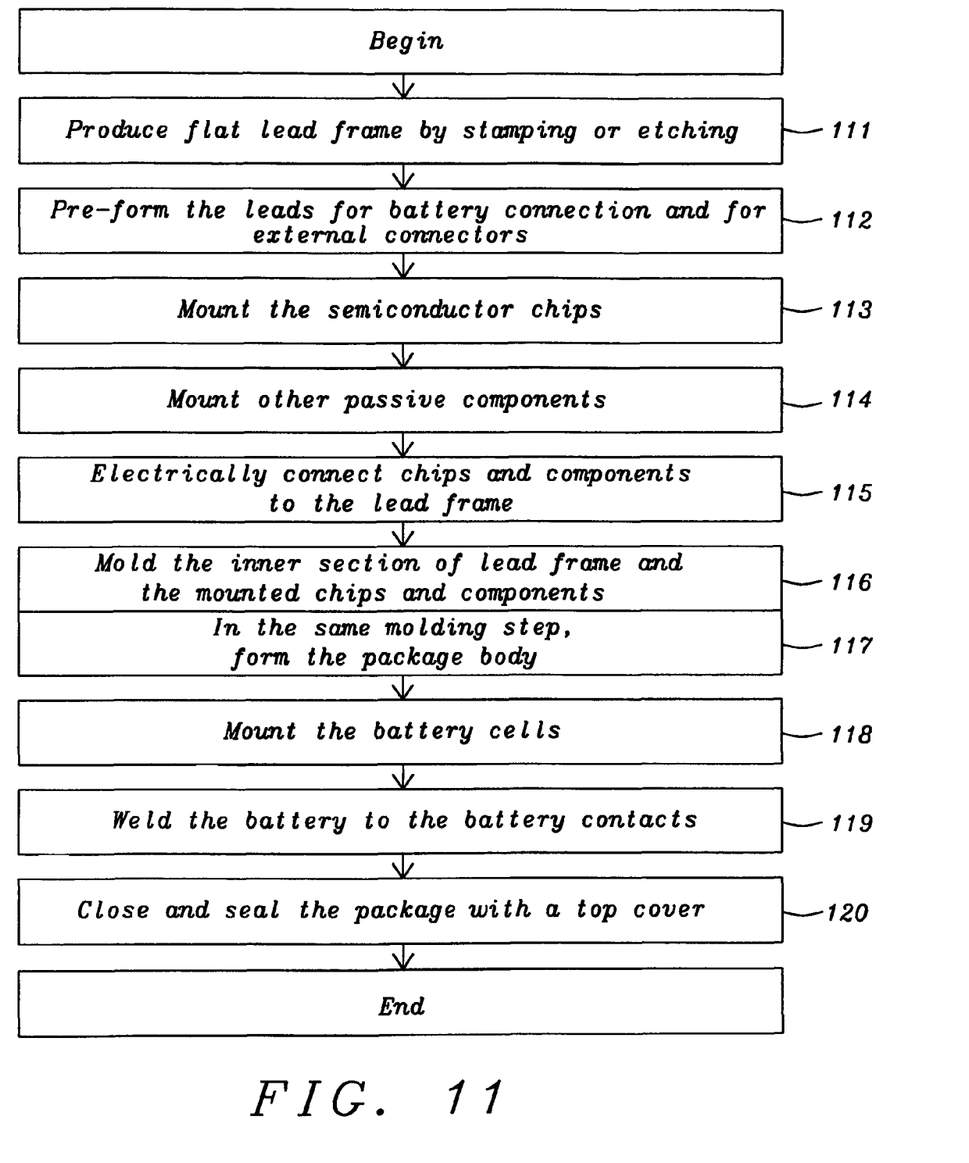
FIG. 11 shows the basic steps of the production process.

The production process of the integrated battery package involves several steps: in a first step 111a flat lead frame is produced by stamping or etching or a similar process. Then in step 112 the leads for battery connection and for external connectors may be pre-formed. Now in 113 the semiconductor chips, and possibly other passive components are mounted 114. Further, in 115, the semiconductor chips and other passive components will be electrically connected to the lead frame. Then the inner section of lead frame and the mounted chips and components are encapsulated with plastic material by the molding process, step 116. The same molding process also forms the package body, 117. In the next step 118 the battery cells will be mounted and the battery contacts are welded or glued to the battery cells 119. Now close and seal the package with a top cover in the final step 120.

While the invention has been particularly shown and described with reference to the preferred embodiments thereof, it will be understood by those skilled in the art that various changes in form and details may be made without departing from the spirit and scope of the invention.

What is claimed is:

1. A closed battery package, comprising:
   one or more battery cells inside the package;
   one or more semiconductor chips to control the battery operation;
   a single lead frame, mechanically carrying said semiconductor chips and providing electrical connection to said semiconductor chips, to said battery cells inside the package as well as providing connectors to the outside of said package;
   some of the leads of said lead frame being preformed into a form, building the battery contacts;
   some of the leads of said lead frame being preformed into a form, building the external contacts of said battery package;
   a plastic mold, encapsulating said semiconductor chips and the inner area of said lead frame;
   said plastic mold forming the supporting structure and the bottom part of said closed battery package; and
   one or more additional case elements forming the top cover for said closed battery package, enclosing all internal components and connections, including the semiconductor to battery connection, only leaving the essential external connections being exposed outside of said package.

2. The assembly of claim 1 wherein said one or more semiconductor chips control and regulate battery charging and monitor the package operation.

3. The assembly of claim 1 wherein said one or more semiconductor chips are connected to the lead frame connectors by wire bonding.

4. The assembly of claim 1 wherein said one or more semiconductor chips are connected to the lead frame connectors with solder balls.

5. The assembly of claim 1 wherein additional passive components are mounted to said lead frame and are electrically connected to said semiconductor chip through said lead frame.

6. The assembly of claim 5 wherein said additional passive components are additional capacitors.

7. The assembly of claim 1 wherein said plastic mold, forming the supporting structure, forms the bottom part of the case of said battery package.

8. The assembly of claim 1 wherein said additional case elements forming the top cover of said closed battery package are fixed and sealed to said bottom part of said closed battery package with a sealing adhesive.

9. The assembly of claim 1 wherein said lead frame is formed to carry the external contacts on opposite sides of the total package assembly.

10. The assembly of claim 1 wherein said lead frame is formed to carry the external contacts on the same side of the total package assembly.

11. The assembly of claim 1 wherein said lead frame is formed to carry the external contacts on the bottom side of the total package assembly.

* * * * *